(12) United States Patent
Neibig

(10) Patent No.: US 7,643,308 B2
(45) Date of Patent: Jan. 5, 2010

(54) DEVICE AND METHOD FOR DAMPING CAVITY RESONANCE IN A MULTI-LAYER CARRIER MODULE

(75) Inventor: Uwe Neibig, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/545,548

(22) PCT Filed: Oct. 9, 2003

(86) PCT No.: PCT/DE03/03340

§ 371 (c)(1),
(2), (4) Date: Aug. 25, 2006

(87) PCT Pub. No.: WO2004/073367

PCT Pub. Date: Aug. 26, 2004

(65) Prior Publication Data

US 2006/0291176 A1    Dec. 28, 2006

(30) Foreign Application Priority Data

Feb. 11, 2003   (DE) ................................ 103 05 520

(51) Int. Cl.
*H05K 7/00* (2006.01)

(52) U.S. Cl. ............... 361/760; 361/763; 361/792; 174/260

(58) Field of Classification Search ............... 361/760, 361/763, 780, 792, 793, 816, 818, 395; 257/532, 257/738, 690, 734; 174/255, 260–262, 395
See application file for complete search history.

(56) References Cited

U.S. PATENT DOCUMENTS

| | | | | |
|---|---|---|---|---|
| 4,371,746 A | * | 2/1983 | Pepper, Jr. ............... 178/18.05 |
| 5,272,600 A | * | 12/1993 | Carey ........................ 361/792 |
| 5,341,274 A | * | 8/1994 | Nakatani et al. ............ 361/818 |
| 5,708,400 A | * | 1/1998 | Morris ........................ 333/12 |
| 5,844,762 A | | 12/1998 | Yamamura et al. | |
| 5,898,576 A | | 4/1999 | Lockwood et al. | |
| 5,926,377 A | * | 7/1999 | Nakao et al. ................ 361/763 |

(Continued)

FOREIGN PATENT DOCUMENTS

DE    198 02 243    7/1999

(Continued)

OTHER PUBLICATIONS

*Electromagnetic Noise Suppression for Electronic Cards and Boards*, IBM Technical Disclosure Bulletin, vol. 33, No. 7, Dec. 1990, pp. 243-246.

*Primary Examiner*—Tuan T Dinh
*Assistant Examiner*—Xiaoliang Chen
(74) *Attorney, Agent, or Firm*—Kenyon & Kenyon LLP

(57) ABSTRACT

A device for damping cavity resonance effects in a multilayer carrier device, having a first conductive device for making available a reference potential layer of the carrier device; a second conductive device that is electrically insulated from the first conductive device for making available a voltage supply layer of the carrier device; and at least one discrete, lossy circuit component, which is connected between the first and the second conductive device and is dimensioned as a function of at least one cavity resonance of the carrier device. Also provides a method for damping cavity resonance effects in a multilayer carrier device.

24 Claims, 2 Drawing Sheets

U.S. PATENT DOCUMENTS

| | | | |
|---|---|---|---|
| 5,966,294 A | 10/1999 | Harada et al. | |
| 6,129,459 A * | 10/2000 | Kishimoto et al. | 703/5 |
| 6,143,990 A * | 11/2000 | Kuramochi et al. | 174/260 |
| 6,166,457 A | 12/2000 | Iguchi et al. | |
| 6,198,362 B1 | 3/2001 | Harada et al. | |
| 6,215,373 B1 * | 4/2001 | Novak et al. | 333/22 R |
| 6,418,031 B1 | 7/2002 | Archambeault | |
| 6,509,640 B1 * | 1/2003 | Li et al. | 257/690 |
| 6,512,181 B2 * | 1/2003 | Okubo et al. | 174/255 |
| 6,525,622 B1 * | 2/2003 | Novak et al. | 333/32 |
| 6,546,528 B1 * | 4/2003 | Sasaki et al. | 716/5 |
| 6,557,154 B1 * | 4/2003 | Harada et al. | 716/11 |
| 6,580,931 B1 * | 6/2003 | Shiotsu et al. | 455/575.1 |
| 6,614,663 B1 * | 9/2003 | Yokota et al. | 361/780 |
| 6,704,669 B2 * | 3/2004 | Mayo et al. | 702/64 |
| 6,727,774 B1 * | 4/2004 | Novak | 333/12 |
| 6,775,122 B1 * | 8/2004 | Dishongh et al. | 361/301.5 |
| 6,789,241 B2 * | 9/2004 | Anderson et al. | 716/5 |
| 7,070,340 B2 * | 7/2006 | Crane et al. | 385/92 |
| 2002/0015293 A1 * | 2/2002 | Akiba et al. | 361/793 |
| 2002/0017700 A1 * | 2/2002 | Mori et al. | 257/532 |
| 2005/0098882 A1 * | 5/2005 | Kusagaya et al. | 257/734 |
| 2005/0230146 A1 * | 10/2005 | Koyama | 174/255 |
| 2007/0166761 A1 * | 7/2007 | Moore | 435/7.1 |

FOREIGN PATENT DOCUMENTS

| | | |
|---|---|---|
| JP | 10135645 | 5/1998 |
| JP | 10190237 | 7/1998 |
| JP | 11261181 | 9/1999 |
| JP | 2001147952 | 5/2001 |
| JP | 2004134500 A * | 4/2004 |
| WO | WO 99/60699 | 11/1999 |
| WO | 02 41673 | 5/2002 |

* cited by examiner

DEVICE AND METHOD FOR DAMPING CAVITY RESONANCE IN A MULTI-LAYER CARRIER MODULE

FIELD OF THE INVENTION

The present invention relates to a device and a method for damping cavity resonance effects in a multilayer carrier device, and particularly in a multilayer printed circuit board or in a multilayer μ hybrid.

BACKGROUND INFORMATION

In order to improve the electromagnetic compatibility (EMV) of printed circuits, which, in particular, are operated having a high pulse frequency, a broadband, low impedance design of the voltage supply system is of great importance. That applies especially to digital circuits in which high, and, in future, further rising pulse frequencies and signal frequencies having short rise times are to be processed.

SUMMARY OF THE INVENTION

A usual implementation to ensure the electromagnetic compatibility may be, for example, developing the supply voltage wiring and the reference potential wiring as continuous planes or layers, as is available in multilayer printed circuit boards and μ hybrids. Between these voltage supply layers and reference potential layers, typically, in addition, so-called blocking capacitors are connected, in order to achieve a low impedance of the supply system, even in the lower frequency range.

In FIG. 4, the quantity $|Z_E|$ of the input impedance is plotted against the frequency f in MHz, which was calculated numerically between the continuous voltage supply layer and reference potential layer of a rectangular, two-layer 160×100 mm²-sized test printed circuit board having a 0.5 mm-thick substrate in between. Measurements taken on real printed circuit boards demonstrate a comparable impedance curve. The impedance behaves approximately like that of a series resonant circuit. In the lower frequency range, especially below the series resonant frequency of approximately 148 MHz, $|Z_E|$ may be simply reduced by connecting blocking capacitors in parallel to the two strata or layers. In the upper frequency range, numerous parallel resonances and series resonances overlay the impedance curve, that are brought about by reflections at the edge of the printed circuit board. They may be described as cavity resonances, the cavity resonance having the lowest frequency $F_{R,min}$ in a rectangular printed circuit board being able to be determined at $$f_{R,min} = \frac{c_0}{2 \cdot l_{max} \cdot \sqrt{\varepsilon_r}}$$

from the greatest printed circuit board edge length $l_{max}$ and the relative dielectric constant E of the printed circuit board substrate. In the test printed circuit board, according to FIG. 4, the first cavity resonance appears at a frequency of about 442 MHz, which agrees well with the analytically calculated value from the above equation by substituting $\varepsilon_r$=4.5.

The high impedances of the cavity resonances should be reduced so that pulse and signal frequencies, which are concurrent with the parallel resonance frequencies of the cavity resonances, do not impair the EMV of the printed circuit. Two methods are known for damping such resonances, the first method according to Koch, M.; Franz, J.; John, W.: Theoretical and measuring technology determination of the influence of continuous supply and ground layers of printed circuit boards in multilayer technology on blocking, from the volume on the session of the meeting "Electromagnetic Compatibility", Karlsruhe, Feb. 22-24, 1994, published by VDE-Verlag, Berlin, 1994, pp 511-520 being based on the high frequency termination of the printed circuit board edge. Because of the HF termination, the reflections from the printed circuit board edge, and thus the resonances are reduced. To achieve this, the printed circuit board edge should be terminated with the impedance that corresponds to the free-space impedance of the printed circuit board substrate. However, such a termination leads to a very low dc resistance between the voltage supply layer and the reference potential layer, so that a dc voltage separation is required.

In the second method for damping the cavity resonances, according to the publication "Electromagnetic Noise Suppression for Electronic Cards and Boards", IBM Technical Disclosure Bulletin, Vol. 33, No. 7, December 1990, on pages 243-246, New York, USA, the cavity resonances appeared to be damped by an increase of the losses of the circuit board substrates. This may be done in practice, according to German Published Patent Application No. 198 02 243, with the aid of ferrites, which generate magnetic losses increasing with frequency, and are added, for example, in the form of powder, to the epoxy resin used as the substrate material.

SUMMARY OF THE INVENTION

The device according to the present invention, for damping cavity resonances in a multilayer carrier device having the features, and the method according to the present invention, for damping cavity resonances in a multilayer carrier device having the features, have the advantage, compared to the known attempts at a solution, that cavity resonances are effectively suppressed without an intervention in the production of the printed circuit board. In this manner, especially in contrast to the first method, one avoids a high expenditure in the manufacture of the printed circuit board or hybrid, so that, according to the present invention, a more cost-effective opportunity for damping cavity resonances is made available The idea on which the present invention is based is essentially to provide a damping of cavity resonances by discrete, lossy components which, similarly to known blocking capacitors, are connected between the voltage supply layer and the reference potential layer.

In other words, for the damping of cavity resonances in a multilayer carrier device, there is provided a first conductive device for making available a reference potential layer of the carrier device; a second conductive device, insulated from the first conductive device, for making available a voltage supply layer of the carrier device; and at least one discrete, lossy circuit component which is connected between the first and second conductive devices, and is dimensioned as a function of at least one cavity resonance of the carrier device.

According to one preferred development, the discrete, lossy circuit component has a predetermined ohmic and a predetermined capacitive component. This involves the advantage of a dimensioning of the load, in which no load occurs in response to a dc voltage. The capacity should be selected so that, with the resulting parasitic inductance of the discrete, lossy circuit component, it forms an oscillating circuit having a resonance frequency close to a corresponding cavity resonance frequency. The loss resistance of the discrete, lossy circuit component should be selected so that the cavity resonance is damped in as optimal a manner possible.

According to one additional preferred refinement, the at least one discrete, lossy circuit component is situated in a predetermined region of the carrier device. This involves the advantage of an efficient position of the discrete, lossy circuit component on the carrier device.

According to a further preferred refinement, in each case, for a cavity resonance of the carrier device, a discrete, lossy circuit component is provided in each case in a predetermined region of the carrier device, dimensioned separately as a function of the respective cavity resonance. Consequently, in an advantageous manner, at various locations in the carrier device, a respective cavity resonance may be damped with maximum success.

According to one additional preferred refinement, the at least one discrete, lossy circuit component is situated in the region of the maximum of the electrical field strength of a cavity resonance. This ensures a maximal efficiency in the damping of the cavity resonance.

According to another preferred development, in a rectangular carrier device, a discrete, lossy circuit component is situated in the edge region of one of the short sides, for damping of a preferably first cavity resonance. In this context, it is of advantage that the first cavity resonance is able to be damped in optimal fashion.

According to another preferred development, in a rectangular carrier device, a discrete, lossy circuit component is situated in the edge region of one of the long sides, for damping of a preferably second cavity resonance. Because of this favorable position, the second cavity resonance is damped as well as possible.

According to another preferred development, in a rectangular carrier device, a discrete, lossy circuit component is situated in a corner region for damping of a preferably third cavity resonance. Because of this position of the lossy circuit component, an optimal damping of the third cavity resonance is ensured. According to one further preferred refinement, the carrier device is a multilayer printed circuit board or a multilayer P hybrid for accommodating electrical components.

DETAILED DESCRIPTION

Figure 1:
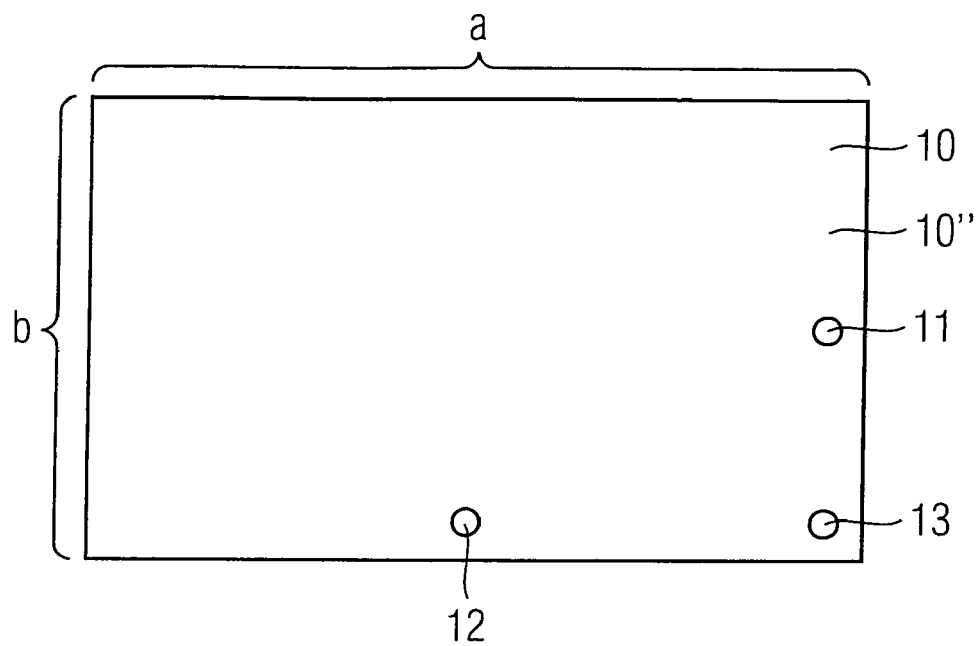
FIG. 1 shows a schematic top view of a components carrier device to explain a specific embodiment of the present invention.

In the figures, the same reference numerals denote the same or finctionally equivalent component parts.

Figure 2:
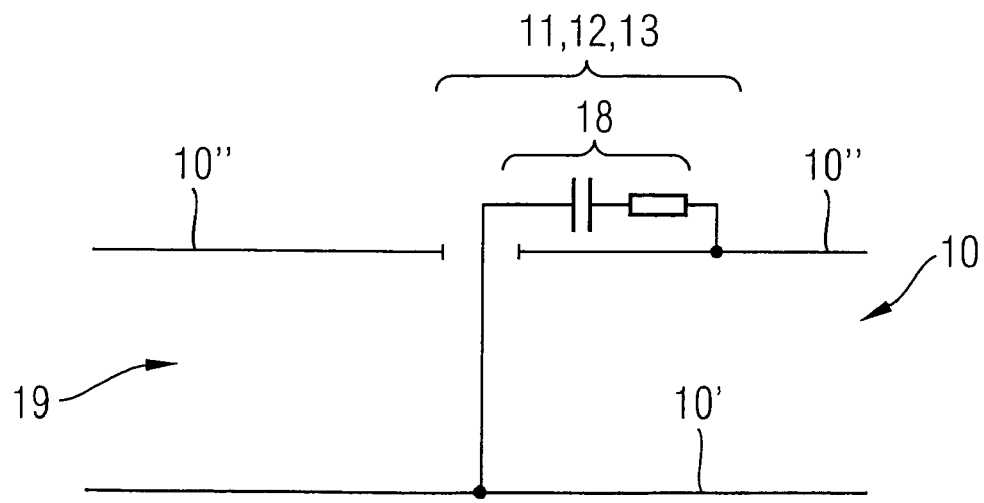
FIG. 2 shows a schematic cross sectional view of a components-carrier device enlarged in cutout to explain a specific embodiment of the present invention.

FIG. 1 shows a multilayer carrier device 10, especially a multilayer printed circuit board or a multilayer hybrid, in a top view. Multilayer carrier device 10 has a first electrically conductive layer 10' for providing a reference potential (not shown in FIG. 1), and, electrically insulated from this, a second essentially continuous electrically conductive layer 10" for providing a supply voltage. As insulation material (not shown in FIG. 1) between the two conductive planes 10', 10", an epoxy resin is provided, for example. Apart from these two continuous planes 10', 10", the voltage supply layer and/or reference potential layer 10', 10" also being able to include a partial area of components-carrier device 10, components-carrier device 10 may have any number of additional planes, electrically insulated from one another, having structured printed circuit boards With reference to FIGS. 1 and 2, in predetermined regions 11, 12 and 13, according to the present invention, for the damping of cavity resonances that develop between voltage supply plane 10" and reference potential plane 10' and may lead to impedance overshoots, discrete, lossy bipolar components or circuit components 18 may be connected. These discrete, lossy circuit components 18 are connected as usual blocking capacitors between the continuous supply voltage layers and reference potential layers 10', 10" of carrier device 10, that is, especially of a printed circuit board or a μ hybrid. In order to have a maximally damping influence, a discrete, lossy circuit component 18 is placed in such a way that it is located in the region of an appearing maximum of the electrical field strength of a corresponding cavity resonance.

Therefore, to achieve the best possible effect, it is generally required, for each cavity resonance to be damped, to provide a separate, and preferably also separately dimensioned, discrete lossy circuit component 18. This is explained in greater detail below, using the example of a rectangular printed circuit board according to FIG. 1 of a length a and a width b, with a>b. The first cavity resonance having the resonant frequency $f_{R,1} = c_0/(2 \cdot a \cdot \sqrt{\in_r})$ (see the above equation), according to the paperback book on high frequency technology by Meinke, Grundlach, 4$^{th}$ edition, published by Springer Verlag, Berlin, Heidelberg, N.Y. Tokyo, 1986, has similar electrical field strength maxima at the two short sides a of printed circuit board 10. Accordingly, the discrete, lossy circuit component 18 in edge region 11 of one of the short sides, of length b, of printed circuit board 10 should be positioned approximately centrically for damping the first cavity resonance, and should be connected between reference potential layer and supply voltage layer 10', 10".

The second cavity resonance having resonance frequency $f_{R,2} = C_0/(2 \cdot b \cdot \sqrt{\in_r})$ has electrical field strength maxima at the two long sides of length a. Therefore, for its damping, discrete, lossy component 18 should be connected correspondingly, in edge region 12 of one of the long sides of length a, about centrically. The third cavity resonance has four similar field strength maxima located in cornes 13 of printed circuit board 10, so that discrete, lossy circuit component 18 should be positioned correspondingly in one of cornes 13.

A square printed circuit board (not shown) represents a special case, since in this case the resonance frequencies of the first and second cavity resonance coincide, and are identical as a result. Therefore, using one single discrete, lossy circuit component 18, which may be positioned in any corner 13 of the square printed circuit board and connected between the reference potential layer and supply voltage layer 10', 10", both cavity resonances may effectively be damped.

By contrast to blocking capacitors (not shown), which should usually have as low an ohmic loss resistance as possible, it is necessary that discrete, lossy circuit components 18 have a certain ohmic loss resistance R. For each cavity resonance, and thus for each discrete, lossy circuit component 18, a value may be found which has the effect of an optimal damping of the undesired impedance overshoot. In order that discrete, lossy circuit components 18 should not unnecessarily load the current supply at dc voltage, a dc voltage separation is required.

Such a dc voltage kind of decoupling may be achieved by a coupling capacitor C connected in series with ohmic loss resistor R. Discrete, lossy circuit component 18, connected between reference potential layer and supply voltage layer 10', 10", has, as do all bipolar components, an unavoidable total inductance formed from the component inductance and the connection inductance to the electrically conductive layers. If coupling capacitor C is selected so that it gets into series resonance with the parasitic total inductance at the resonance frequency of a cavity resonance, the undesired influence of the inductance is eliminated, so that an optimal damping may be achieved. This optimization of the capacitance of coupling capacitor C is possible because, preferably for each cavity resonance, a separate discrete, lossy circuit component is used. In the practical implementation, discrete, lossy circuit component 18 may be made up of a lossy capacitor C having an appropriately dimensioned capacitance.

Figure 3:
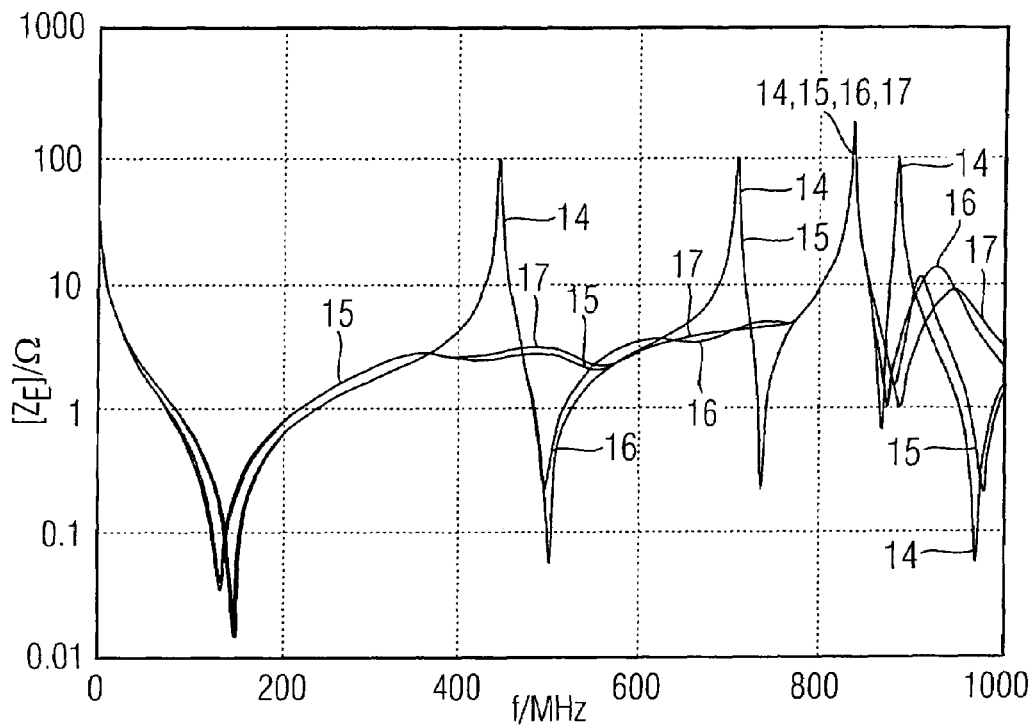
FIG. 3 shows a schematic frequency response characteristics diagram for explaining the functioning method of a specific embodiment of the present invention.
Figure 4:
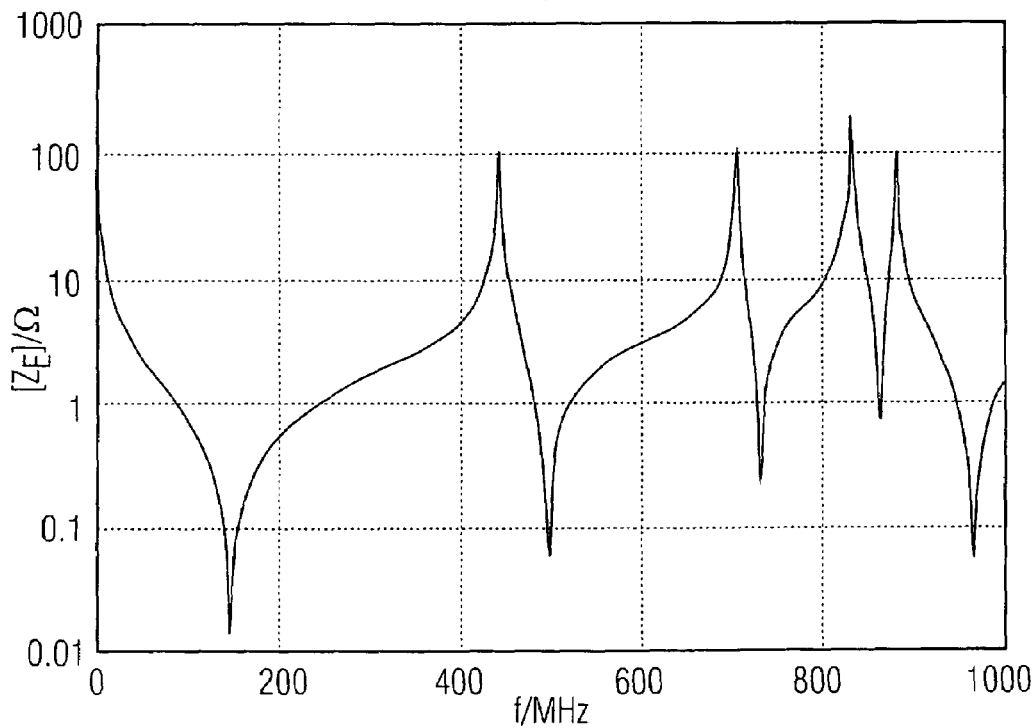
FIG. 4 shows a schematic representation of the frequency response characteristics of a usual components-carrier device.

FIG. 3 shows calculated frequency response characteristics of the input impedance $|Z_E|$ of a 160×100 mm²-sized test printed circuit board having correspondingly optimized loads. Curve 14 makes clear the frequency response characteristic without a discrete, lossy circuit component. Diagram 15 shows the frequency response characteristic with a discrete, lossy component for damping the first cavity resonance. Diagram 16 shows the frequency response characteristic with a discrete, lossy component for damping the second cavity resonance. And diagram 17 shows the frequency response characteristic with two discrete, lossy component for damping the first and second cavity resonance.

FIG. 3 shows the effect of discrete, lossy circuit components 18 optimized by calculation for damping the first two cavity resonances in the above test printed circuit board. Numerically calculated frequency response characteristic $|Z_E|$ without lossy components is shown with a lossy component at right printed circuit board edge 11, with a lossy component at lower printed circuit board edge 12 and with these two lossy components.

At an arbitrarily assumed component inductance of 0.5 nH, the optimization for the first load yields a capacitance of 150 pF and a resistance of 1.5Ω. For the second load, values of 50 pF and 2.0Ω are yielded. The cavity resonances are thereby clearly reduced. Let us say, for example, that the first cavity resonance having a maximum of $|Z_E|$=98Ω is damped to a value of 2.7Ω. Then, by this same relationship, which is equivalent to 31.2 dB, the interference voltage is accordingly also reduced, which causes pulse or signal currents in this frequency range. In addition, FIG. 3 shows that individual optimized discrete, lossy circuit components 18 or components do not interfere with one another in combination, i.e. do not exert any disadvantageous influence on one another. In the selected printed circuit board dimensions, which are typically destined for numerous electronic units, one may actually achieve one frequency range having low impedance, using only two discrete, lossy circuit components 18, which complies with the practical requirements.

The effectiveness of the damping of cavity resonances may be detected directly using a high frequency impedance measurement between voltage supply layer and reference potential layer 10' 10" of a printed circuit board 10. It may also be detected in the cavity resonant frequencies with the aid of a reduced interference voltage on the voltage supply system.

Although the present invention was described above in light of a preferred exemplary embodiment, it is not restricted to it, but is able to be modified in many ways.

For example, the present invention may be used for all electronic units which are implemented as multilayer component carrier devices, i.e. especially printed circuit boards or μ hybrids, and have in each case a continuous voltage supply layer and reference potential layer or stratum, the voltage supply layer and/or the reference potential layer also being able to include a partial area of the printed circuit board surface. It is appropriate for circuits whose pulse frequencies and signal frequencies have an interfering component in the frequency range of the occurring cavity resonances.

Since no modifications on the printed circuit board itself are necessary, but only discrete, lossy circuit components 18 have to be assembled, the present invention may, in principle, also be retrofitted. If lossy capacitors, to act as the load, were not available cost-effectively enough, discrete, lossy circuit component 18 or the load may also be formed as a series circuit from a standard resistor R and a standard capacitor C.

As a cost-effective variant, one choice would be to use a single suitably placed discrete, lossy circuit component 18, by which the first three cavity resonances are able to be damped, which, in practice, is sufficient for many printed circuit board applications. It is true that the corresponding three cavity resonances are not able to be damped to the extent they can be using individually optimized and separately placed loads according to FIG. 1 and FIG. 3, but the damping of the first three cavity resonances still amounts to about 20 dB, which already represents a considerable improvement of the electromagnetic influencing of a printed circuit board.

Consequently, an effective damping of cavity resonances is ensured at low additional expenditure in cost-effective components, along with easy integration into existing concepts and without serious intervention in the production of a component carrier device or a printed circuit board.

| LIST OF REFERENCE NUMERALS | |
|---|---|
| 10 | multilayer carrier device, e.g. printed circuit board |
| 10' | conductive device, e.g. reference potential plane |
| 10" | conductive device, e.g. voltage supply plane |
| 11 | connecting area of a discrete, lossy circuit component between a voltage supply layer and a reference potential layer of the carrier device |
| 12 | connecting area of a discrete, lossy circuit component between a voltage supply layer and a reference potential layer of the carrier device |
| 13 | connecting area of a discrete, lossy circuit component between a voltage supply layer and a reference potential layer of the carrier device |
| 14 | frequency response characteristic without a discrete, lossy component |
| 15 | frequency response characteristic with a discrete, lossy component (for damping the first cavity resonance) |
| 16 | frequency response characteristic with a discrete, lossy component (for damping the second cavity resonance) |
| 17 | frequency response characteristic with a discrete, lossy component (for damping the first and second cavity resonance) |
| 18 | lossy circuit component, e.g. capacitor in series with an ohmic resistor |
| 19 | electrical insulation, e.g. made of epoxy resin |
| R | ohmic resistor |
| C | capacitor |
| a,b | length of sides |

What is claimed is:

1. A device for damping a cavity resonance effect in a multilayer carrier device, comprising:
   a first conductive device for making available a reference potential layer of the carrier device;
   a second conductive device that is electrically insulated from the first conductive device and for making available a voltage supply layer of the carrier device; and
   at least one discrete, lossy circuit component that is connected between the first conductive device and the second conductive device, wherein the dimensions of the at least one discrete, lossy circuit component are based on the at least one cavity resonance of the carrier device;

wherein the at least one discrete, lossy circuit component is not a blocking capacitor or a bypass capacitor, and wherein an oscillating circuit is formed with a resonant frequency at a cavity resonant frequency of the carrier device.

2. The device as recited in claim 1, wherein the at least one discrete, lossy circuit component includes a predetermined ohmic component and a predetermined capacitive component.

3. The device as recited in claim 1, wherein the at least one discrete, lossy circuit component includes one of a coupling capacitor lossy with ohmic losses and a series circuit including a coupling capacitor and an ohmic resistor.

4. The device as recited in claim 1, wherein the at least one discrete, lossy circuit component is situated in a predetermined region of the carrier device.

5. The device as recited in claim 4, wherein in each case, for the at least one cavity resonance of the carrier device, a separate one of the at least one discrete, lossy circuit component is provided in each case in the predetermined region of the carrier device, dimensioned separately as a function of the respective cavity resonance.

6. The device as recited in claim 4, wherein the at least one discrete, lossy circuit component is situated in a region of a maximum electrical field strength of the at least one cavity resonance.

7. The device as recited in claim 1, wherein the carrier device includes one of a multilayer printed circuit board and a multilayer μ hybrid for accommodating electrical components.

8. The device as recited in claim 1, wherein the at least one discrete, lossy circuit component includes a predetermined ohmic component and a predetermined capacitive component, wherein the at least one discrete, lossy circuit component includes one of a coupling capacitor lossy with ohmic losses and a series circuit including a coupling capacitor and an ohmic resistor, and wherein the at least one discrete, lossy circuit component is situated in a predetermined region of the carrier device.

9. The device as recited in claim 8, wherein in each case, for the at least one cavity resonance of the carrier device, a separate one of the at least one discrete, lossy circuit component is provided in each case in the predetermined region of the carrier device, dimensioned separately as a function of the respective cavity resonance.

10. The device as recited in claim 8, wherein the at least one discrete, lossy circuit component is situated in a region of a maximum electrical field strength of the at least one cavity resonance.

11. The device as recited in claim 1, wherein the carrier device includes one of a multilayer printed circuit board and a multilayer μ hybrid for accommodating electrical components.

12. The device as recited in claim 1, wherein the at least one discrete, lossy circuit component includes one of (i) a lossy capacitor, and (ii) a standard resistor and a standard capacitor in series.

13. The device as recited in claim 12, wherein the coupling capacitor achieves series resonance with a parasitic total inductance at a resonance frequency of a cavity resonance.

14. A method for damping a cavity resonance effect in a multilayer carrier device, comprising:

providing a reference potential layer by a first conductive device of the carrier device;

providing a voltage supply layer by a second conductive device that is electrically insulated from the first conductive device of the carrier device;

connecting at least one discrete, lossy circuit component between the first conductive device and the second conductive device; and dimensioning the at least one discrete, lossy circuit component based on at least one cavity resonance of the carrier device;

wherein the at least one discrete, lossy circuit component is not a blocking capacitor or a bypass capacitor, and wherein an oscillating circuit is formed with a resonant frequency at a cavity resonant frequency of the carrier device.

15. The method as recited in claim 14, wherein the at least one discrete, lossy circuit component includes a predetermined ohmic component and a predetermined capacitive component.

16. The method as recited in claim 14, wherein the at least one discrete, lossy circuit component includes one of a coupling capacitor lossy with ohmic losses and a series circuit including a coupling capacitor and an ohmic resistor.

17. The method as recited in claim 14, wherein the at least one discrete, lossy circuit component is situated in a predetermined region of the carrier device.

18. The method as recited in claim 17, wherein in each case, for the at least one cavity resonance of the carrier device, a separate one of the at least one discrete, lossy circuit component is provided in each case in the predetermined region of the carrier device, dimensioned separately as a function of the respective cavity resonance.

19. The method as recited in claim 17, wherein the at least one discrete, lossy circuit component is situated in a region of a maximum electrical field strength of the at least one cavity resonance.

20. The method as recited in claim 19, wherein the carrier device includes one of a multilayer printed circuit board and a multilayer μ hybrid for accommodating electrical components.

21. The method as recited in claim 14, wherein the at least one discrete, lossy circuit component includes a predetermined ohmic component and a predetermined capacitive component, wherein the at least one discrete, lossy circuit component includes one of a coupling capacitor lossy with ohmic losses and a series circuit including a coupling capacitor and an ohmic resistor, and wherein the at least one discrete, lossy circuit component is situated in a predetermined region of the carrier device.

22. The method as recited in claim 21, wherein in each case, for the at least one cavity resonance of the carrier device, a separate one of the at least one discrete, lossy circuit component is provided in each case in the predetermined region of the carrier device, dimensioned separately as a function of the respective cavity resonance.

23. The method as recited in claim 21, wherein the at least one discrete, lossy circuit component is situated in a region of a maximum electrical field strength of the at least one cavity resonance.

24. The method as recited in claim 14, wherein the carrier device includes one of a multilayer printed circuit board and a multilayer μ hybrid for accommodating electrical components.

* * * * *